(12) United States Patent  
Aoyagi et al.

(10) Patent No.: US 7,405,431 B2  
(45) Date of Patent: Jul. 29, 2008

(54) LIGHT-EMITTING SEMICONDUCTOR DEVICE HAVING AN OVERVOLTAGE PROTECTOR

(75) Inventors: Hidekazu Aoyagi, Niiza (JP); Tetsuji Matsuo, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 141 days.

(21) Appl. No.: 11/225,837

(22) Filed: Sep. 13, 2005

(65) Prior Publication Data

US 2006/0056123 A1    Mar. 16, 2006

(30) Foreign Application Priority Data

Sep. 15, 2004    (JP) ............................. 2004-268792

(51) Int. Cl.
*H01L 27/15* (2006.01)
(52) U.S. Cl. .............................. 257/79; 257/98; 257/99; 257/103
(58) Field of Classification Search ................... 257/79, 257/91, 98, 99, 103; 438/22, 23, 25, 46
See application file for complete search history.

(56) References Cited

U.S. PATENT DOCUMENTS 6,037,603 A * 3/2000 Nelson ......................... 257/14
6,156,581 A * 12/2000 Vaudo et al. ................... 438/22
6,549,389 B2 * 4/2003 Anthony et al. .............. 361/117
6,696,704 B1 * 2/2004 Maeda et al. ................... 257/98
6,853,011 B2 * 2/2005 Lin ............................... 257/99
2004/0051111 A1 * 3/2004 Ota et al. ........................ 257/98
2005/0271107 A1 * 12/2005 Murakami et al. ......... 372/50.1

FOREIGN PATENT DOCUMENTS

JP    11-214747    8/1999

* cited by examiner

*Primary Examiner*—Zandra Smith  
*Assistant Examiner*—Paul E Patton  
(74) *Attorney, Agent, or Firm*—Woodcock Washburn LLP

(57) ABSTRACT

An LED includes a light-generating semiconductor region having an active layer sandwiched between two confining layers of opposite conductivity types for generating light. A cathode is arranged centrally on one of the opposite major surfaces of the semiconductor region from which is emitted the light. A reflector of electroconductive material is formed on the other major surface of the semiconductor region for reflecting the light back toward the light-emitting surface of the semiconductor region. For protecting the LED against breakdown from overvoltages, a zener diode is employed which takes the form of a baseplate having two semiconductor regions of opposite conductivity types sandwiched between a pair of electrodes in the form of metal layers. The protector baseplate is integrated with the light-generating semiconductor region by joining one of the metal layers to the reflector under heat and pressure, thus serving as both mechanical support and overvoltage protector for the LED.

14 Claims, 7 Drawing Sheets

LIGHT-EMITTING SEMICONDUCTOR DEVICE HAVING AN OVERVOLTAGE PROTECTOR

CROSS REFERENCE TO RELATED APPLICATIONS

This application claims priority to Japanese Patent Application No. 2004-268792, filed Sep. 15, 2004.

BACKGROUND OF THE INVENTION

This invention relates to light-emitting semiconductor devices, or light-emitting diodes (LEDs) according to common parlance, which find use in lamps, displays and so forth. More particularly, the invention pertains to light-emitting semiconductor devices made from nitrides and other Groups III-V compound semiconductors, and, still more particularly, to those incorporating an overvoltage protector for saving them from electrical breakdown due to voltage surges. The invention also deals with a method of making such overvoltage-protected light-emitting semiconductor devices.

Light-emitting semiconductor devices made from nitrides and other Groups III-V compound semiconductors are capable of withstanding voltage surges only up to 100 volts or so. These devices were therefore susceptible to breakdown from overvoltages due to static electricity. Japanese Unexamined Patent Publication No. 11-214747 represents a conventional remedy to this problem, teaching an integration of a light-emitting semiconductor device and an overvoltage protector therefor. The specific construction according to this unexamined patent application is a superposition of a flip-chip light-emitting device on a protecting zener diode via a bump electrode.

This known solution is objectionable because of the need for fabrication of the flip-chip light-emitting device and the overvoltage protector independently of each other. Such loose integration of the two functional components made the overvoltage-proof light-emitting device unnecessarily bulky in size and complex and costly in construction.

SUMMARY OF THE INVENTION

The present invention seeks to combine a light-emitting semiconductor device and an overvoltage protector therefor into an integrated semiconductor device of simpler, more compact and less expensive construction than heretofore.

According to the invention, briefly summarized in one aspect thereof, there is provided a light-emitting semiconductor device protected against electrical breakdown due to overvoltages. Included is a light-generating semiconductor region having at least a first and a second semiconductor layer of opposite conductivity types for generating light. The first semiconductor layer is exposed at a first major surface of the semiconductor region, and the second semiconductor layer at a second major surface, opposite to the first major surface, of the semiconductor region. A first electrode is electrically connected to the first semiconductor layer of the light-generating semiconductor region. A conductor layer of electroconductive material, which may be either reflective or transparent depending upon the optical design of the complete device, is connected both electrically and mechanically to the second major surface of the light-generating semiconductor region. A second electrode is electrically connected to the conductor layer. Also included is an overvoltage protector which is connected both electrically and mechanically to the conductor layer for protecting the light-generating semiconductor region from overvoltage breakdown.

In a preferred embodiment the conductor layer is a reflector, preferably made from silver or silver-base alloy, which reflects the light from the light-generating semiconductor region for emission from the first major surface thereof. The overvoltage protector takes the form of a diode constituted of two semiconductor regions of opposite conductivity types between a pair of electrodes in the form of metal layers. The protector diode as a whole is sturdy enough to serve as a baseplate for the LED constituted of the light-generating semiconductor region, the reflector and the electrodes. The baseplate built from the overvoltage protector is herein termed the protector baseplate.

For coupling the protector baseplate to the LED one of the meal layer electrodes of the diode is joined to the metal-made reflector of the LED under heat and pressure. Thus the integration of the LED and the overvoltage protector is realized by the metal-to-metal fusion coupling of the parts that inherently belong to the two components, thereby accomplishing the objects set forth above.

Another aspect of the invention concerns a method of making an overvoltage-protected light-emitting semiconductor device of the foregoing construction. The light-generating semiconductor region is first grown on a substrate in a gaseous phase. The constituent layers of the light-generating semiconductor region are grown in such an order that the first major surface of the semiconductor region, from which light is to be emitted as aforesaid, is now held against the substrate. Then the electric conductor layer (reflector in the preferred embodiment) is formed on the second major surface of the light-generating semiconductor region. Then the protector baseplate, prepared separately as a semiconductor diode, is joined as above explained to the second major surface of the light-generating semiconductor region via the conductor layer.

The overvoltage-protected light-emitting device is believed to be manufacturable most efficiently and inexpensively on a mass production basis by this method. The substrate on which the light-emitting semiconductor region is grown becomes unnecessary upon completion of the growth of the semiconductor region. The substrate may therefore be removed from the semiconductor region immediately thereupon. However, since the protector baseplate is bonded to the second major surface of the semiconductor region, not to the light-emitting first major surface thereof which is held against the substrate, the substrate may alternatively be removed from the semiconductor region after the bonding of the protector baseplate to the semiconductor region.

The above and other objects, features and advantages of this invention will become more apparent, and the invention itself will best be understood, from a study of the following description and appended claims, with reference had to the attached drawings showing some preferable embodiments of the invention.

DETAILED DESCRIPTION

Figure 1:
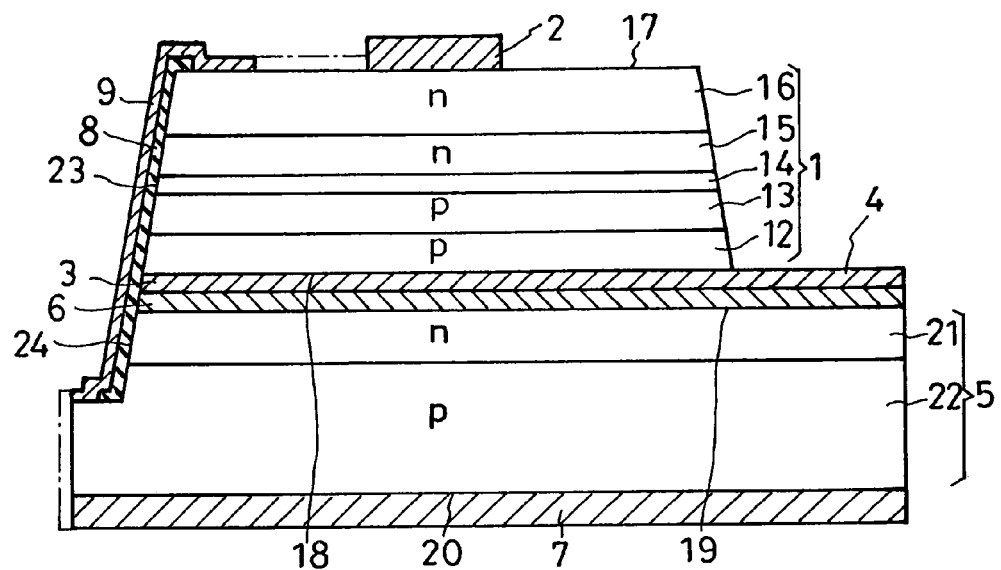
FIG. 1 is a cross section through an overvoltage-protected LED embodying the principles of this invention.

The overvoltage-protected light-emitting semiconductor device illustrated in FIG. 1 by way of the first preferred embodiment of the invention is, broadly, a combination of a light-generating semiconductor region 1 and a protector baseplate 5, the latter serving as both overvoltage protector and mechanical support for the former. As indicated by schematic electronic symbols in FIG. 2, the light-generating semiconductor region 1 provides an LED 10, and the protector baseplate 5 a zener diode 11. The LED 10 and protector diode 11 are electrically connected reversely in parallel with each other.

The zener diode 11 protects the LED 10 from forward overvoltages by breaking down, and so becoming conductive, when the applied voltage reaches a value known as the avalanche breakdown voltage or zener voltage. The breakdown voltage is intermediate the normal forward voltage and maximum allowable forward voltage of the LED. The zener diode 11 also conducts when a reverse voltage in excess of a prescribed limit is impressed to the LED 10, thereby protecting the same from reverse overvoltages as well.

With reference back to FIG. 1 the light-generating semiconductor region 1 is provided with a first electrode or cathode 2 mounted centrally on the first major surface 17 of the semiconductor region. A reflector 3 of electroconductive material covers the entire second major surface 18 of the light-generating semiconductor region 1 for reflecting the light therefrom toward the first major surface of the semiconductor region. The reflector 3 has an extension projecting laterally of the light-generating semiconductor region 1 to provide a second electrode or anode 4 arranged in offset relationship to the semiconductor region.

The protector baseplate 5 is provided with its own first electrode or cathode which takes the form of a bonding metal layer 6 on a first major surface 19 of the baseplate, and a second electrode or anode in the form of a metal layer 7 on a second major surface 20, opposite to the first major surface 19, of the baseplate. The first electrode or bonding metal layer 6 serves both as electrode and, by being fused onto the reflector 3 of the LED, for mechanically coupling the protector baseplate 5 to the light-generating semiconductor region 1. Covering the sides of the light-generating semiconductor region 1 and protector baseplate 5 is an insulating layer 8 on which is formed a connector 9 providing a necessary electrical connection between LED and zener diode.

Figure 3:
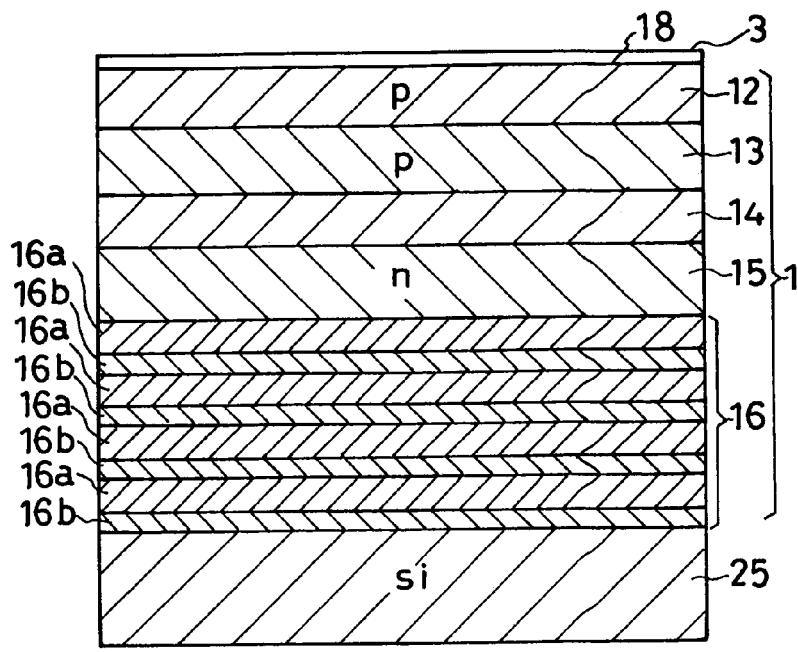
FIG. 3 is a cross section through the light-generating semiconductor region of the LED, shown together with the substrate on which it has been grown, by way of a first step for fabricating the FIG. 1 device by the method of this invention.

The light-generating semiconductor region 1 is shown as a lamination of a p-type buffer lay 12 of a nitride semiconductor, a p-type semiconductor layer or cladding 13, an active layer 14, an n-type semiconductor layer or cladding 15, and a multi-sublayered n-type current-spreading layer 16, all grown epitaxially on a substrate seen at 25 in FIG. 3. (The substrate 25 is unseen in FIG. 1 because it is removed from the light-generating semiconductor region 1 following the epitaxial growth of the layers 12-16 thereon.)

The light-generating semiconductor region 1 as a whole has the pair of opposite major surfaces 17 and 18 which are parallel to the active layer 14. Light issues from the first major surface 17. The current-spreading layer 16 is exposed at the first major surface 17, and the buffer layer 12 at the second major surface 18. Notwithstanding the showing of FIG. 1 it is only the p-type semiconductor layer cladding 13 and n-type semiconductor layer or cladding 15 that are absolutely necessarily for generating light. All or some of the other layers 12, 14 and 16 of the semiconductor region 1 might therefore be omitted as desired. Also, as desired or required, some other layer such as an ohmic contact layer might be added to the semiconductor region 1.

The following is a more detailed disclosure of the compositions of the constituent layers 12-16 of the light-emitting semiconductor region 1.

Lying next to the reflector 3, the p-type buffer layer 12 is made from any of the nitride semiconductors containing p-type impurity (acceptor) that are generally defined as:

$Al_a In_b Ga_{1-a-b} N$ where the subscripts a and b are both numerals that are each equal to or greater than zero and less than one. The buffer layer 12 is made from p-type aluminum indium gallium nitride (AlInGaN) to a thickness of 30 nanometers in this particular embodiment of the invention.

The p-type cladding 13 on the buffer layer 12 is made from, in addition to a p-type dopant, any of the nitride semiconductors that are generally defined as:

$Al_x In_y Ga_{1-x-y} N$ where the subscripts x and y are both numerals that are each equal to or greater than zero and less than one. The p-type cladding 13 is made from GaN (both x and y are zero in the formula above) to a thickness of 0.2 micrometer in this embodiment of the invention. It has a greater bandgap than the active layer 14.

The active layer 14 on the p-type cladding 13 is made from any of the nitride semiconductors that are generally defined as:

$Al_x In_y Ga_{1-x-y} N$ where the subscripts x and y are both numerals that are each equal to or greater than 1 and less than 1. The particular substance adopted in this embodiment is InGaN (x is zero in the formula above). FIG. 1 shows one active layer 14 for simplicity; in practice, the known multiple quantum well configuration may be adopted, although single quantum well structure is employable as well. It is even possible to eliminate the active layer 14 altogether and to place the claddings 13 and 15 in direct contact with each other. Still further, while the active layer 14 is undoped with a conductivity determinant in this embodiment, an either p- or n-type determinant might be added as required.

The n-type cladding 15 on the active layer 14 may be made from any of the nitride semiconductors that are generally defined as:

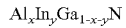

$Al_xIn_yGa_{1-x-y}N$ where the subscripts x and y are both numerals equal to or greater than zero and less than one, plus an n-type dopant. The n-type cladding 15 is made from n-type GaN (both x and y are zero in the formula above) to a thickness of 500 nanometers in this embodiment and has a bandgap greater than the active layer 14.

The current-spreading layer 16 is higher in n-type impurity concentration than the underlying n-type cladding 15. It could also be termed a contact layer. As illustrated in more detail in FIGS. 3 and 4, which indicate two different steps during the manufacture of the FIG. 1 device, the current-spreading layer 16 is constituted of alternations of two sublayers $16_a$ and $16_b$. These figures, however, show only four of possibly many more alternations of the current-spreading sublayers $16_a$ and $16_b$; actually, as many as twenty to sixty alternations of these sublayers may be made. Forty alternations of the current-spreading sublayers $16_a$ and $16_b$ are adopted in this particular embodiment.

The first sublayers $16_a$ of the current-spreading layer 16 may be made from, aside from an n-type dopant, any of the n-type nitride semiconductors that are generally expressed as:

$Al_aM_bGa_{1-a-b}N$ where M is at least either of indium and boron; the subscript a is a numeral equal to or greater than zero and equal to or less than one; the subscript b is a numeral equal to or greater than zero and less than one; and the sum of a and b is equal to or less than one.

The substances meeting these requirements for the materials of the first current-spreading sublayers $16_a$ include GaN, InGaN, InBGaN, AlGaN, AlInGaN, and AlInBGaN. The particular substance employed in this embodiment is n-type GaN (both a and b are zero in the formula above). The first current-spreading sublayers $16_a$ of this composition have a greater bandgap than the active layer 14 and are each 25 nanometers thick, although their thickness could be anywhere from 15 to 500 nanometers. The first current-spreading sublayers $16_a$ would not sufficiently create a two-dimensional electron gas layer if less than 15 nanometers thick. If more than 500 nanometers thick, on the other hand, then the first current-spreading sublayers would absorb too much light, diminishing the efficiency of light emission by the device.

The second sublayers $16_b$ of the current-spreading layer 16 may be made from, aside from an n-type dopant, any of the n-type nitride semiconductors that are generally expressed as:

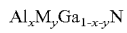

$Al_xM_yGa_{1-x-y}N$ where M is at least either of indium and boron; the subscript x is a numeral greater than zero and equal to or less than one; the subscript y is a numeral equal to or greater than zero and less than one; and the sum of x and y is equal to or less than one. Further the subscript x is greater than the subscript a in the formula above defining the materials for the first current-spreading sublayers $16_a$.

The second current-spreading sublayers $16_b$ are made from materials capable of forming heterojunctions with the first current-spreading sublayers $16_a$, examples being AlN, AlGaN, AlInGaN, and AlInBGaN. The second current-spreading sublayers $16_b$ of these compositions are capable of creating two-dimensional electron gas layers in the first current-spreading sublayers $16_a$.

The particular substance employed for the second current-spreading sublayers $16_b$ in this embodiment is AlN (x is one and y is zero in the formula above). The second current-spreading sublayers $16_b$ have a greater bandgap than the active layer 14 and are each five nanometers thick, thinner than each first current-spreading sublayer $16_a$ but thick enough to provide the quantum-mechanical tunnel effect. Broadly speaking, each second current-spreading sublayer $16_b$ may be from 0.5 to 5.0 nanometers thick. The second current spreading sublayers $16_b$ might fail to provide a two-dimensional electron gas layer if less than 0.5 nanometer thick. If more than 5.0 nanometers thick, on the other hand, then the second current-spreading sublayers $16_b$ might not provide the tunnel effect, resulting in an increase in resistance in their thickness direction.

Comprising the sublayers $16_a$ and $16_b$ capable of two-dimensional electron gas production, the current-spreading layer 16 is highly transmissive of the light generated at the active layer 14. Additionally, besides being low in resistance in its thickness direction, the current-spreading layer 16 provides the two-dimensional electron gas layers of extremely low resistance which extend parallel to the light-emitting surface 17. The two-dimensional electron gas layers expedite current flow transversely of the current-spreading layer 16.

Made from a metal such as nickel or gold or from an alloy of such metals, the first electrode or cathode 2 is positioned approximately centrally of the first major surface 17 of the light-generating semiconductor region 1, or of the topmost second sublayer $16_b$ of the current-spreading layer 16. The electrode 2 makes direct ohmic contact with the n-type current spreading layer 16. It is approximately one micrometer thick, blocking the passage of light therethrough, in order to serve as a wire-bonding pad. Although the electrode 2 is placed in contact with only a limited part of the surface of the current-spreading layer 16, the current-spreading layer makes it possible for the current to flow throughout the entire active layer 14, inclusive of its annular peripheral region which is out of register with the electrode.

The reflector 3, which makes ohmic contact with the second major surface 18 of the light-generating semiconductor region 1 or of the p-type buffer layer 12, is made from a reflective metal or metals. Silver or silver-base alloy is preferred in order for the reflector 3 to be highly reflective besides making hood ohmic contact with the light-generating semiconductor region 1. A particularly preferred composition of the silver-base alloy is from 90.0 to 99.5 weight percent silver and from 0.5 to 10.0 weight percent additive or additives. The additive or additives may be selected from among such alloyable elements as copper (Cu), gold (Au), palladium (Pd), neodymium (Nd), silicon (Si), iridium (Ir), nickel (Ni), tungsten or wolfram (W), zinc (Zn), gallium (Ga), titanium (Ti), magnesium (Mg), yttrium (Y), indium (In), and tin or stannum (Sn).

The additive or additives may be chosen from among the listed elements for one or more of the following three purposes: (a) to save the silver-base alloy reflector 3 from oxidation; (b) to save the reflector from sulfurization; and (c) to prevent the reflector from alloying with the light-generating semiconductor region 1. Copper and gold are particularly effective to prevent the oxidation of the reflector, and zinc and tin to prevent the sulfurization of the reflector. The silver or silver-base alloy reflector 3 in the event of oxidation or sulfurization would make poor ohmic contact with the light-generating semiconductor region 1 and become less reflective. The reflector 3 would become even worse in reflectivity if a fairly thick alloy region were created at its interface with the light-generating semiconductor region 1.

There is an additional reason why the reflector 3 should be kept from oxidation or sulfurization. The reflector 3 is used for joining the light-generating semiconductor region 1 to the protector baseplate 5, as will become better understood from the subsequent disclosure of the method of making the FIG. 1 device. The reflector 3 of oxidized or sulfurized silver or silver-base alloy would prevent a firm bonding of the light-generating semiconductor region 1 and protector baseplate 5.

It must also be taken into account that the higher the proportion of the additive or additives with respect to that of silver, the better will the resulting reflector be guarded against oxidation or sulfurization, but the less will it be in reflectivity. The proportion of the additive or additives should therefore be from 0.5 to 10.0 percent by weight of silver in order to assure higher reflectivity than the prior art aluminum reflector and sufficient ohmic contact with the light-generating semiconductor region 1. The reflector 3 might not be saved from oxidation or sulfurization if the additive proportion were less than 0.5 weight percent, and might not be reflective enough if the additive proportion exceeded 10.0 weight percent. A preferred range of the additive proportion is from 1.5 to 5.0 weight percent.

The reflector 3 should be at least 50 nanometers thick in order to prevent transmission of the light therethrough and at least 80 nanometers thick to assure firm bonding of the protector baseplate 5 to the light-generating semiconductor region 1. However, if more than 1500 nanometers thick, the reflector 3 of silver or silver-base alloy might develop cracks. The reflector 3 should therefore be from 50 to 1500 nanometers, preferably from 80 to 1000 nanometers, in thickness. The bonding metal layer 6 will lend itself to use as reflector, too, if made from silver or silver-base alloy. The reflector 3 itself may then be made thinner by the thickness of the bonding metal layer 6.

The bonding metal layer 6, which may be of either a metal or an alloy, is connected, both mechanically and electrically, to the reflector 3 on one hand and, on the other hand, makes ohmic contact with the major surface 19 of the protector baseplate 5. Thus the bonding metal layer 6 doubles as anode of the LED and as cathode of the overvoltage protector.

As seen from above in FIG. 1, the protector baseplate 5 is made larger than the light-generating semiconductor region 1 in order to provide an offset projecting rightwardly of the semiconductor region. Both reflector 3 and bonding metal layer 6 have rightward extensions overlying the offset, thereby providing the second electrode or anode for the LED. Optionally, an additional metal layer, not shown, may be provided on these extensions of the reflector 3 and bonding metal layer 6 for use as part of the second electrode 4. Another option is to form the second electrode 4 only by the extension of either reflector 3 or bonding metal layer 6. Various other alternatives to the illustrated configuration of the second electrode 4 will suggest themselves to the specialists within the scope of this invention.

The bonding metal layer 6 may be made from silver or silver-base alloy if the reflector 3 is of either of these materials, not simply to lend itself to use as part of the reflector as aforesaid but additionally to assure positive bonding of the protector baseplate 5 to the light-generating semiconductor region 1. The reflector 3 and bonding metal layer 6 are fused to each other under heat and pressure, although they may be interconnected electrically, too, by making them from other electroconductive materials.

Made from silicon, the protector baseplate 3 serves the triple purpose of protecting the LED from overvoltages, mechanically supporting the light-generating semiconductor region 1, and radiating heat therefrom. The protector baseplate 3 is constituted of an n-type semiconductor region 21, which is exposed at its first major surface 19, and a p-type semiconductor region 22 exposed at its second major surface 20, in order to provide the overvoltage protector in the form of the zener diode 11, FIG. 2. The n-type semiconductor region 21 makes ohmic contact with the bonding metal layer 6 which serves as the cathode of the zener diode 11. The p-type semiconductor region 22 makes ohmic contact with the anode in the form of the metal layer 7 on the second major surface 20 of the protector baseplate 3. The metal layer 7 is made from gold, nickel or other metals or alloys. The protector baseplate 5 may be from 200 to 500 micrometers thick in order to gain sufficient strength to serve as a mechanical support for the light-generating semiconductor region 1. The silicon-made baseplate 5 is a good heat radiator, being higher in heat conductivity than the nitride semiconductor light-generating region 1.

FIG. 1 also reveals the insulating layer 8 covering the side surface 23 of the light-generating semiconductor region 1 and the side surface 24 of the protector baseplate 5. Formed on this insulating layer 8 is the connector 9, preferably of gold, which makes ohmic contact with the p-type semiconductor region 22 of the protector baseplate 5 on one hand and, on the other hand, with the n-type current spreading layer 16 of the light-generating semiconductor region 1. Alternatively, as indicated by the broken lines in FIG. 1, the connector 9 could interconnect the anode 7 of the zener diode and the cathode 2 of the LED.

Method of Fabrication

The manufacture of the overvoltage-protected LED of FIG. 1 by the method of this invention starts with the preparation of the substrate seen at 25 in FIG. 3. Unlike the baseplate 5 seen in FIG. 1, the substrate 25 is intended for gaseous-phase growth of nitride semiconductors thereon, so that it must be of a material that meets this objective. A silicon semiconductor was employed here.

Then, as pictured also in FIG. 3, the light-generating semiconductor region 1 was grown on the substrate 26 by the known organometallic vapor phase epitaxy in the order of top to bottom in FIG. 1, that is, the current-spreading layer 16 foremost and the p-type buffer layer 12 last. The current-spreading layer 16 consisted as aforesaid of forty alternations of the two sublayers $16_a$ and $16_b$.

Then, as shown also in FIG. 3, the reflector 3 was formed by sputtering on the second major surface 18 of the light-generating semiconductor region 1, that is, on top of the last-grown p-type buffer layer 12 of that region. The reflector 3 was formed at 300° C., at which no alloying reaction is to take place between the reflector and the light-generating semiconductor region 1. A creation of an alloy layer should be avoided by any means as it would invite a substantive decrease in reflectivity.

Figure 4:
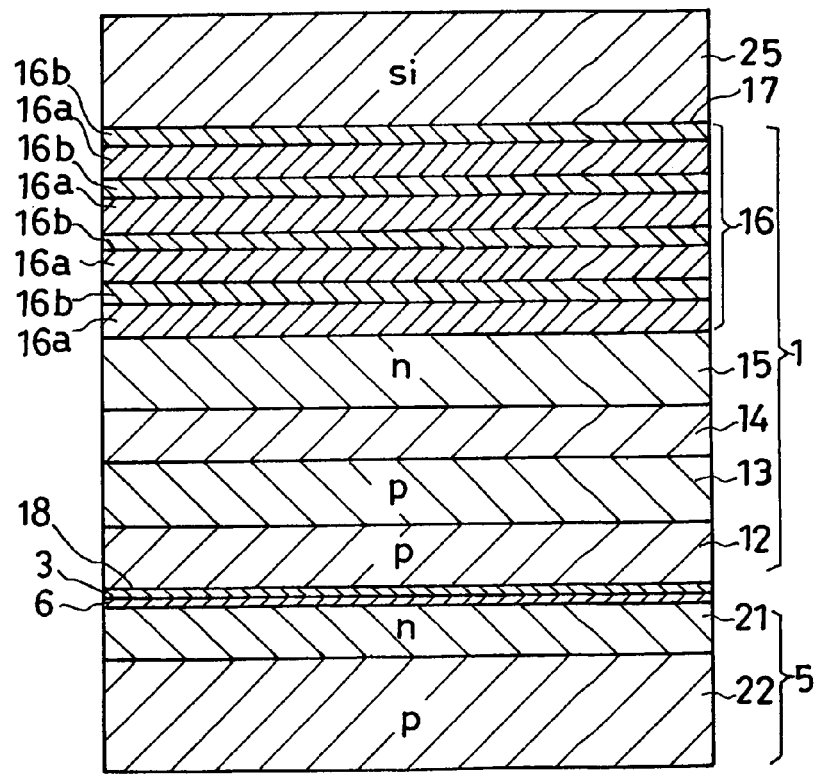
FIG. 4 is a view similar to FIG. 3 except that the protector baseplate is shown bonded to the article of FIG. 3.

The next step was the bonding of the protector baseplate 5 to the light-generating semiconductor region 1 as in FIG. 4. The bonding metal layer 6 was formed on the baseplate 5 by silver sputtering, although a silver-base alloy could be adopted as well. Then the baseplate 5 was bonded to the light-generating semiconductor region 1 (more specifically, to its p-type buffer layer 12) by fusing the bonding metal layer 6 to the reflector 3 under heat and pressure. The temperature of the fusion could be anywhere between 210° and 400° C.

Then, being now unnecessary, the substrate 25 was removed from the light-generating semiconductor region 1, thereby exposing the first major surface 17 of that region. The substrate 25 was removable either chemically, as by etching, or mechanically. The substrate 25 could have been removed prior to the bonding of the protector baseplate 5 to the light-generating semiconductor region 1.

Then the metal layer electrode 7 was formed on the major surface 20 of the protector baseplate 5. The electrode 7 could have been formed before the protector baseplate 5 was bonded to the light-generating semiconductor region 1 as in FIG. 4.

Actually, matrices of light-emitting devices were jointly fabricated on a single semiconductor wafer to be later separated into the individual devices by dicing. Before dicing, the light-generating semiconductor regions 1 were left island-like on the wafer by etching the boundaries therebetween. The boundaries were so etched as to leave part of the reflector 3 of each device projecting from under the associated light-generating semiconductor region 1 thereby providing the second electrode 4 as in FIG. 1. On the opposite side of each device, shown directed to the left in FIG. 1, the reflector 3, bonding metal layer 6 and protector baseplate 5 were etched deeper than on the right-hand side for exposing the p-type semiconductor region 22 of the baseplate.

Then the insulating layer 8 was formed over the left-hand sides of the light-generating semiconductor region 1, reflector 3, bonding metal layer 6, and protector baseplate 5. The insulating layer 8 was of silicon oxide. Then the connector 9 was formed on the insulating layer 8, with its opposite ends joined to the n-type current spreading layer 16 of the light-generating semiconductor region 1 and to the p-type semiconductor region 22 of the protector baseplate 5.

Then the first electrode 2 of the LED was formed on the first major surface 17 of the light-generating semiconductor region 2. Finally, the wafer was diced into the individual overvoltage-protected light-emitting devices each constructed as in FIG. 1. The electrodes 2, 4 and 7 could have been created in other than the steps set forth above.

The advantages gained by the first preferred form of overvoltage-protected light-emitting semiconductor device, described hereinbefore with reference to FIGS. 1-4, may be recapitulated as follows:

1. The reflector 3, essential for efficient light emission, is made from electroconductive material for use in both electrical and mechanical connection of the protector baseplate 5 to the light-generating semiconductor region 1. The overvoltage-protected LED is manufacturable most economically as the LED and overvoltage protector are integrated in what is believed to be the simplest, easiest way.
2. The protector baseplate 5 is made from silicon, which is higher in heat conductivity than the nitride semiconductor light-generating region 1. Furthermore the protector baseplate 5 is held against the entire major surface 18 of the light-generating semiconductor region 1 via the reflector 3 and bonding metal layer 6. For these reasons the protector baseplate 5 is bound to serve well as heat radiator for the light-generating semiconductor region 1.
3. The protector baseplate 5 wholly serves as both mechanical support and overvoltage protector, making it possible to provide an overvoltage-protected light-emitting device of minimal manufacturing cost and minimal size.
4. A further reduction in manufacturing cost and size is accomplished as the overvoltage protector is joined to the LED via the bonding metal layer 6 which doubles as an electrode for the zener diode.
5. Made from silver or silver-base alloy, the reflector 3 attains both objectives of ohmic contact and high reflectivity, with the consequent simplification of the LED construction and reduction of the manufacturing cost.
6. The current-spreading layer 16 is constituted of the heterojunctions of alternating sublayers $16_a$ and $16_b$ which generate two-dimensional electron gas for easier current flow transversely of the layer. The result is a higher current density at that part of the active layer 14 which is out of register with the first electrode 2, resulting in greater light emission from that part of the active layer and in a more uniform current distribution throughout the layer.
7. The LED 10 and zener diode 11 are electrically interconnected by the connector 9 which is formed in one piece with the light-generating semiconductor region 1 and protector baseplate 5 for reduction of manufacturing cost and ease of handling.
8. In sum the invention realizes all the objectives of overvoltage protection, efficiency of light production, cost cuts, and heat radiation.

EMBODIMENT OF FIG. 5

Figure 5:
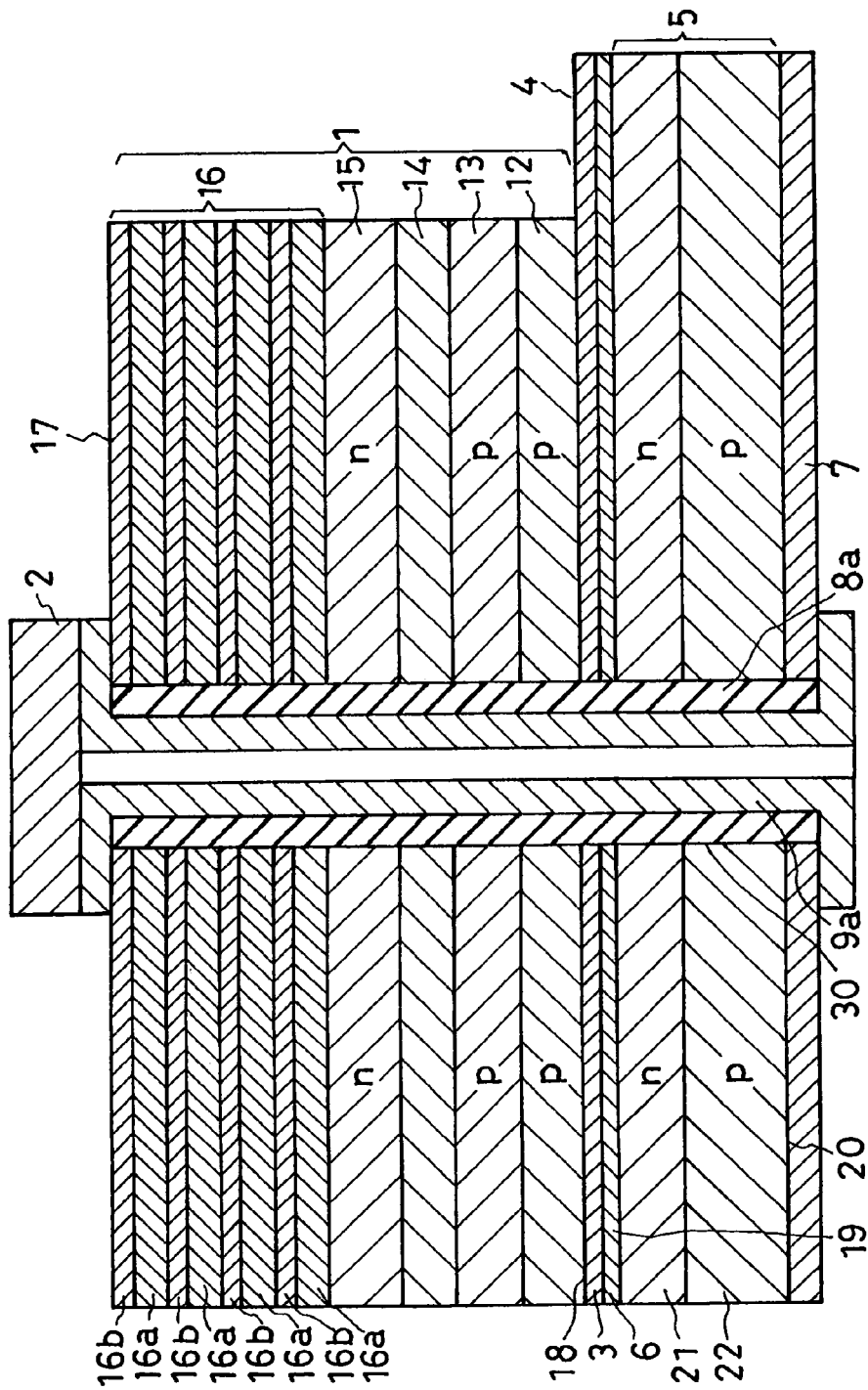
FIG. 5 is a view similar to FIG. 1 but showing another preferred form of overvoltage-protected LED according to the invention.

FIG. 5 shows the second preferred form of overvoltage-protected light-emitting device according to the invention, which is akin in construction to the first preferred form of FIG. 1 except that a different method is employed here for electrically interconnecting the LED and zener diode. The FIG. 5 device has a channel 30 extending centrally therethrough between the major surface 17 of the light-emitting semiconductor region 1 and the major surface 20 of the protector baseplate 5. The channel 30 is in register with the first electrode 2 and less in cross sectional size than the same, so that it does not interfere with light emission by the device.

Received in the channel 30 are a tubular insulator $8_a$ and, within it, a connector $9_a$. The insulator $8_a$ is directly held against the surfaces bounding the channel 30. The connector $9_a$ has a pair of opposite ends both projecting from within the insulator $8_a$ and both flanged. One flanged end of the connector $9_a$ is held against the entire underside of the first electrode 2 in electrical contact therewith. The other flanged of the connector $9_a$ makes electrical contact with the second electrode 7 of the overvoltage protector.

All the other details of construction of the FIG. 5 device are as previously set forth in conjunction with that of FIG. 1, so that this embodiment also gains all the advantages of the preceding embodiment. Additionally, the FIG. 5 device is even more compact in construction than its FIG. 1 counterpart as the connector $9_a$ is wholly received in the channel 30 extending centrally through the device. The efficiency of light production is not sacrificed by this arrangement of the connector.

EMBODIMENT OF FIG. 6

Figure 6:
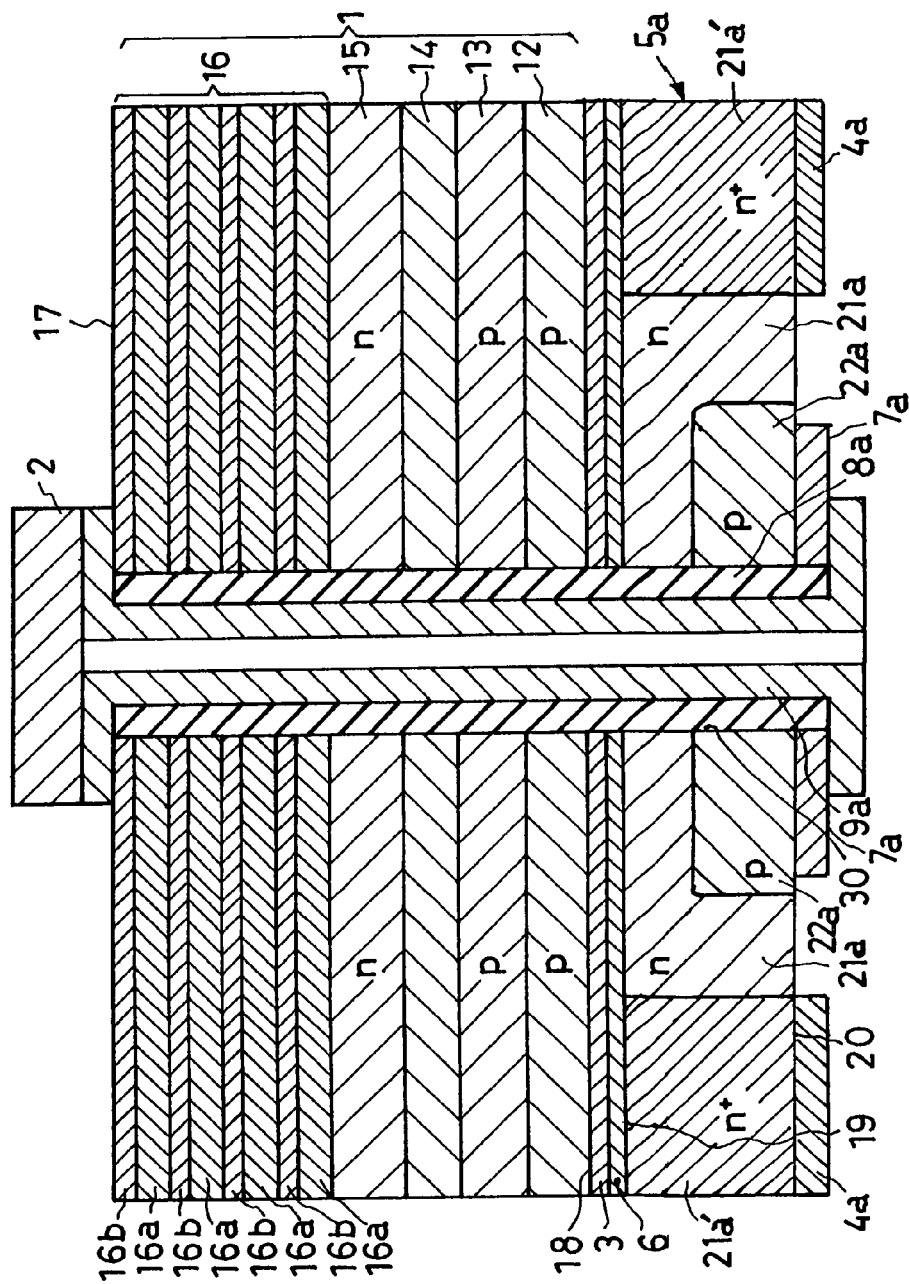
FIG. 6 is also a view similar to FIG. 1 but showing still another preferred form of overvoltage-protected LED according to the invention.

The overvoltage-protected light-emitting device of FIG. 6 is similar in construction to that of FIG. 5 except for a modified protector baseplate $5_a$ and modified electrodes $4_a$ and $7_a$. The modified protector baseplate $5_a$ has a p-type semiconductor region $22_a$ formed islandlike in an n-type semiconductor region $21_a$, both regions $21_a$ and $22_a$ concentrically surrounding the channel 30 extending centrally through the device as in the FIG. 5 embodiment. The islandlike p-type semiconductor region $22_a$ is spaced from the first major surface 19 of the protector baseplate $5_a$ by the n-type semiconductor region $21_a$ but exposed at its second major surface 20, and so, therefore, is the boundary of the pn-junction between the regions $21_a$ and $22_a$. This arrangement of the p-type semiconductor region $22_a$ makes it necessary for the second electrode $7_a$ of the overvoltage protector formed inwardly of the exposed boundary of the pn-junction between the regions $21_a$ and $21_b$.

The protector baseplate $5_a$ additionally includes an $n^+$-type semiconductor region $21_a'$ which is higher in n-type impurity concentration than the n-type semiconductor region $21_a$. Concentrically surrounding the n-type semiconductor region $21_a$, the $n^+$-type semiconductor region $21_a'$ extends wholly between the pair of opposite major surfaces 19 and 20 of the protector baseplate $5_a$ to provide a current path for the LED. The second electrode $4_a$ of the LED is arranged on the second major surface 20 of the protector baseplate $5_a$ in ohmic contact with the $n^+$-type semiconductor region $21_a'$.

The FIG. 6 embodiment permits some additional modifications. One such possible modification is to remove the $n^+$-type semiconductor region $21_a'$ and to use the thus-exposed part of the bonding metal layer 6 or reflector 3 as the second electrode of the LED. Also, a conductor could be installed in place of the $n^+$-type semiconductor region $21_a'$ for use as the second LED electrode 4.

This embodiment offers the advantage, in addition to all those enumerated above, that the necessary connection to the second LED electrode $4_a$ can be done on the second major surface 20 of the protector baseplate $5_a$.

EMBODIMENT OF FIG. 7

Figure 7:
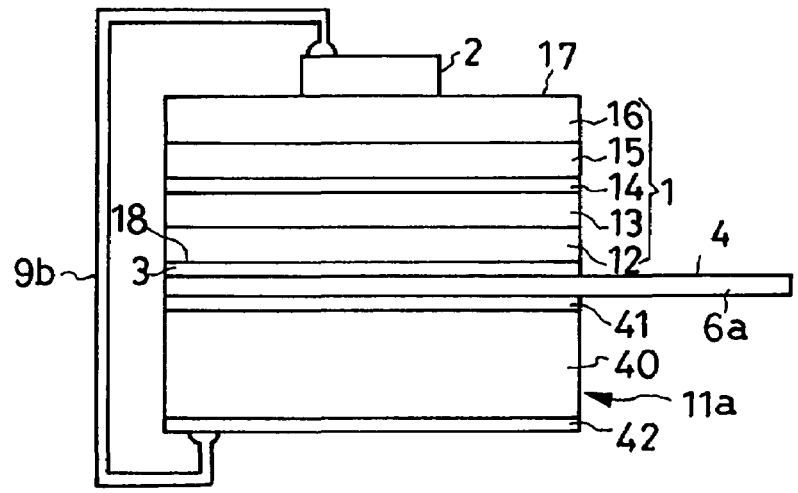
FIG. 7 is a diagrammatic illustration of a further preferred form of overvoltage-protected LED according to the invention.

The overvoltage-protected light-emitting device of FIG. 7 incorporates a varistor $11_a$, instead of the zener diode 11, FIG. 1, as a combined overvoltage protector and baseplate for the LED. The other details of construction are as previously explained with reference to FIGS. 1-4.

Referring more specifically to FIG. 7, the reflector 3 of the LED is fastened with an electroconductive bonding agent to a bonding metal plate $6_a$ which projects laterally of the light-generating semiconductor region 1 to provide the second LED electrode 4. The varistor $11_a$ is affixed to this metal plate $6_a$ with an electroconductive bonding agent. The varistor $11_a$ used here is a familiar semiconductor ceramic varistor, comprising a semiconductor ceramic body 40 sandwiched between a pair of electrodes 41 and 42 on the opposite major surfaces of the body. The first varistor electrode 41 is electrically connected to the LED reflector 3 via the metal plate $6_a$ whereas the second varistor electrode 42 is electrically connected to the first LED electrode 2 via the connector $9_b$.

Figure 2:
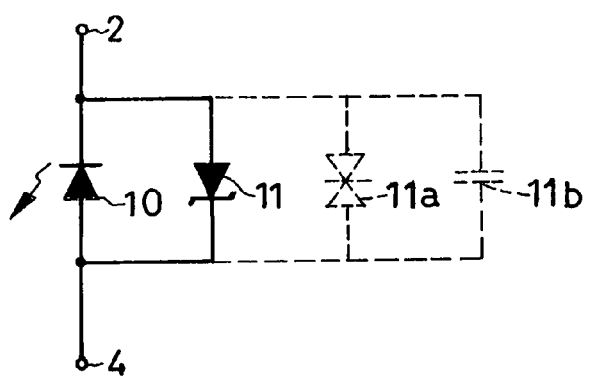
FIG. 2 is a schematic electrical diagram showing the equivalent electric circuit of the FIG. 1 device.

As indicated by the broken lines in FIG. 2, the varistor $11_a$ is connected in parallel with the LED 10. The varistor $11_a$ conducts in response to a prescribed voltage intermediate the normal forward voltage and maximum allowable forward voltage of the LED 10, protecting the same from forward overvoltages. The varistor $11_a$ also conducts upon application of a reverse voltage in excess of a predetermined limit to the LED 10, protecting the same from reverse overvoltages. Thus the overvoltage protector or varistor $11_a$ of this FIG. 7 embodiment is functionally equivalent to the zener diode 11 of the FIG. 1 embodiment.

EMBODIMENT OF FIG. 8

Figure 8:
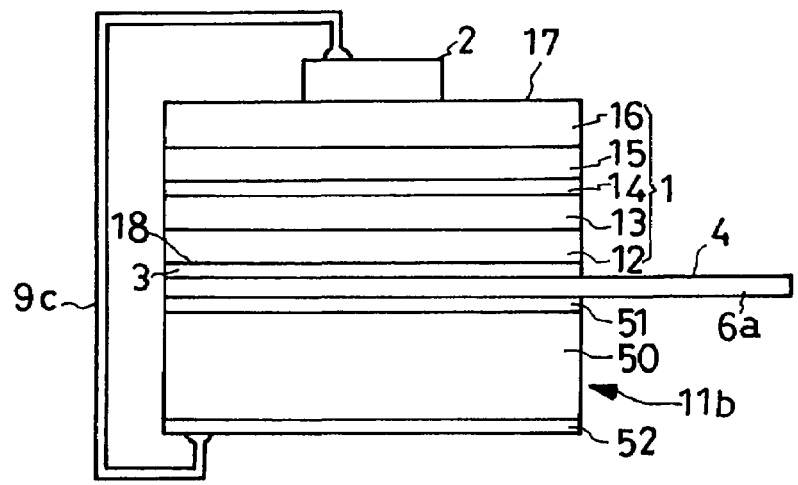
FIG. 8 is an illustration similar to FIG. 7 but showing a further preferred form of overvoltage-protected LED according to the invention.

In FIG. 8 is shown a further preferred form of overvoltage-protected light-emitting device which is analogous with the FIG. 7 device except that a ceramic capacitor $11_b$ is employed in place of the varistor $11_a$ for overvoltage protection. The ceramic capacitor $11_b$ conventionally comprises a ceramic dielectric 50 between a pair of electrodes 51 and 52. The first capacitor electrode 51 is secured and electrically connected to the metal plate $6_a$ with an electroconductive bonding agent, whereas the second capacitor electrode 52 is electrically connected to the first LED electrode 2 via the connector $9_c$.

As is apparent from the foregoing, and again as indicated by the broken lines in FIG. 2, the ceramic capacitor $11_b$ is connected in parallel with the LED 10 for taking up overvoltages and so saving the LED from breakdown. Thus the ceramic capacitor $11_b$ functions just like the zener diode 11 or varistor $11_a$.

EMBODIMENT OF FIG. 9

The reflector 3 of the FIG. 1 device may be made from aluminum instead of from silver or silver-base alloy. However, an aluminum reflector will by itself make no satisfactory ohmic contact with the p-type nitride semiconductor buffer layer 12 of the light-generating semiconductor region 1. Therefore, in FIG. 9, an open-worked ohmic contact layer 60 is inserted between the aluminum reflector 3 and the p-type buffer layer 12. The open-worked ohmic contact layer 60 may be made from any one or more of such metals as Ni, Au, chromium (Cr), vanadium (V), Ti, cobalt (Co), Pd, Ir, osmium (Os), ruthenium (Ru), platinum (Pt), and Cu, or from Al—Ge—Ga alloy or Groups III-V compound semiconductors.

Thus the aluminum reflector 3 borders on the p-type buffer layer 12 in part directly and in part through the ohmic contact regions 60. That is to say that the aluminum reflector 3 is both reflective and in electric contact with the buffer layer 12.

EMBODIMENT OF FIG. 10

Figure 9:
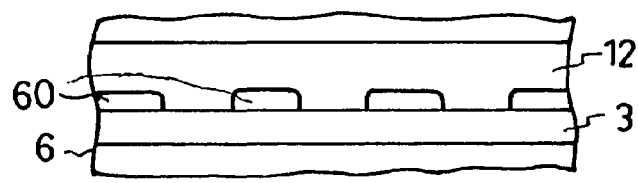
FIG. 9 is a fragmentary, diagrammatic illustration of a further preferred form of overvoltage-protected LED according to the invention.
Figure 10:
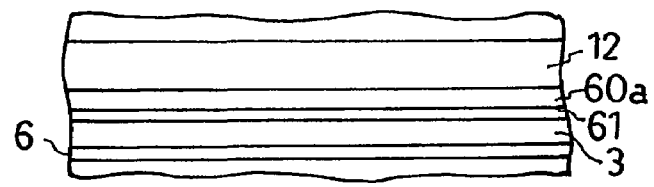
FIG. 10 is an illustration similar to FIG. 9 but showing a further preferred form of overvoltage-protected LED according to the invention.

Instead of the open-worked ohmic contact layer 60 of FIG. 9, a solid or closed ohmic contact layer $60_a$ may be interposed as in FIG. 10 between the aluminum reflector 3 and the p-type nitride semiconductor buffer layer 12. The solid ohmic contact layer $60_a$ can be of the same material as the open-worked ohmic contact layer 60. Additionally, in FIG. 10, an insulating film 61 is inserted between the aluminum reflector 3 and the solid ohmic contact layer $60_a$. The insulating film 61 is made from at least either of silicon dioxide ($SiO_2$), titanium dioxide ($TiO_2$), magnesium oxide (MgO), nickel oxide (NiO), zinc oxide (ZnO), aluminum nitride (AlN), and silicon nitride (SiN). The insulating film 61 should be only so thick (e.g., from 0.5 to 5.0 nanometers) as to permit light transmission therethrough and provide a quantum-mechanical tunnel effect.

The insulating film 61 with its quantum-mechanical tunnel effect electrically interconnects the reflector 3 and ohmic contact layer 60 and further prevents an alloying of these layers. Furthermore, since the ohmic contact layer 60 and insulating film 61 both transmit light, the light from the light-generating semiconductor region travels therethrough for reflection by the reflector 3.

EMBODIMENT OF FIG. 11

Figure 11:
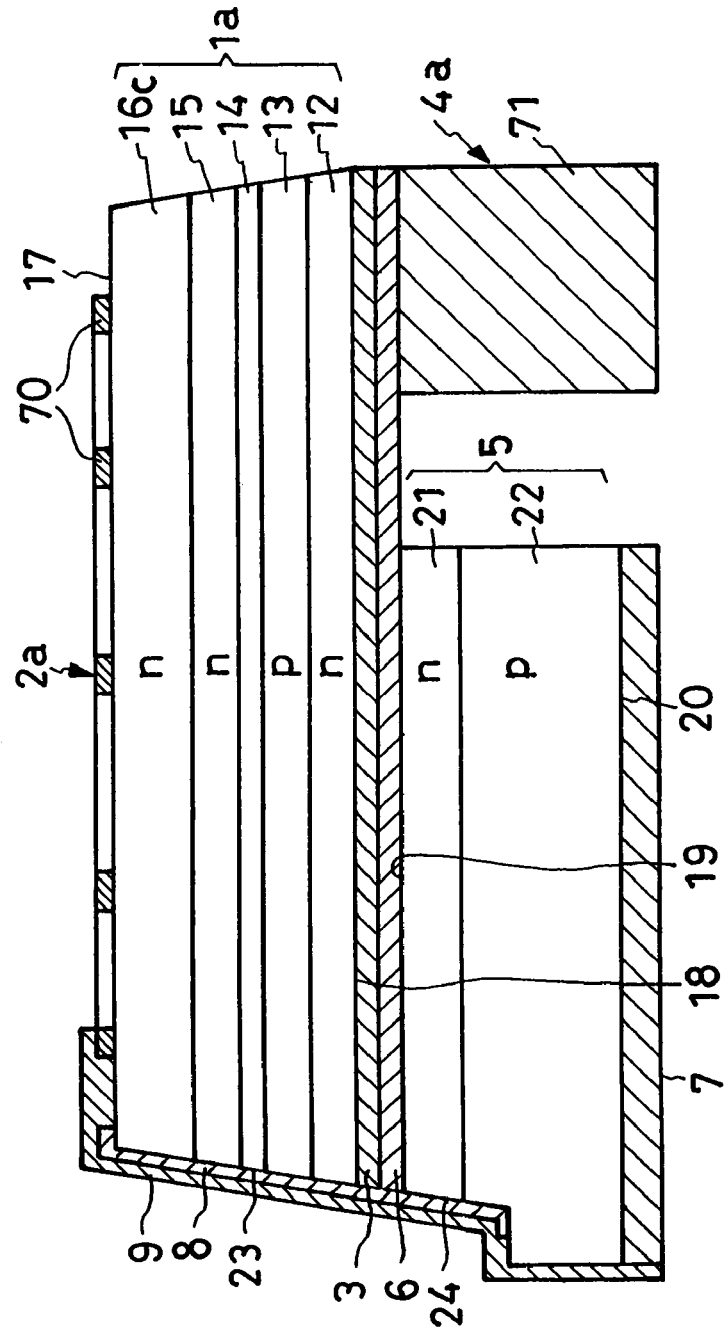
FIG. 11 is a view similar to FIG. 1 but showing a still further preferred form of overvoltage-protected LED according to the invention.

The overvoltage-protected light-emitting device of FIG. 11 is substantially identical in construction with that of FIG. 1 except for a light-generating semiconductor region $1_a$ and electrodes $2_a$ and $4_a$. The light-generating semiconductor region $1_a$ differs from its FIG. 1 counterpart 1 only in that an n-type contact layer $16_c$ of a nitride semiconductor is provided in lieu of the current-spreading layer 16. The n-type contact layer $16_c$ when made thick enough will provide the current-spreading action.

On the first major surface 17 of the light-generating semiconductor region $1_a$, which is defined by the n-type contact layer $16_c$, there is provided the first electrode $2_a$ which is open-worked, by being made up of interconnected, patterned stripes 70 of electroconductive material. The first electrode $2_a$ is connected by the connector 9 both to the p-type semiconductor region 22 of the protector baseplate 5 and to the second electrode 7 on the major surface 20 of the protector baseplate. Thus the first electrode $2_a$ functions as cathode. The electroconductive stripes 70 may be two-dimensionally patterned, as by being arranged either in latticework or concentrically or radially. The first electrode $2_a$ may preferably, and not necessarily, made from such a material and/or to such a thickness as to be transparent to the light generated. Optionally, the first electrode $2_a$ might be provided with a wire bonding pad.

The provision of the open-worked electrode $2_a$ on the entire first major surface $2_a$ of the light-generating semiconductor region $1_a$ provides the advantage of a more uniform current distribution throughout the active layer 14. Being open-worked, moreover, the electrode $2_a$ does not substantially interfere with light emission from the entire first major surface 17.

The modified second electrode $4_a$ of the LED is shown as a bump 71 on the underside of the bonding metal layer 6. The first major surface 19 of the protector baseplate 5 is made less in area than the second major surface 18 of the light-generating semiconductor region $1_a$ in this embodiment, leaving part of the bonding metal layer 6 exposed. The bump electrode 71 is formed on part of the thus-exposed part of the bonding metal layer 6 to a thickness or height approximately equal to the combined thickness of the protector baseplate 5 and electrode metal layer 7. The bump electrode 71 need not necessarily be formed on the bonding metal layer 6; instead, with the exposed part of the bonding metal layer 6 removed, the bump electrode may be formed directly on the reflector 3.

An additional advantage of the FIG. 11 embodiment arises from the coplanar arrangement of the electrode metal layer 7 and bump electrode 1. This arrangement makes the device easier of mounting in its working position. The FIG. 11 embodiment possesses the same advantages as that of FIG. 1, too, as both LED and protector diode are connected between second electrode $4_a$ and electrode metal layer 7, and as the protector baseplate 5 is bonded to the light-generating semiconductor region $1_a$ via the reflector 3. The constructions of the electrodes $2_a$ and $4_a$ shown in FIG. 1 could be applied, either singly or in combination, to any other embodiments disclosed herein.

EMBODIMENT OF FIG. 12

Figure 12:
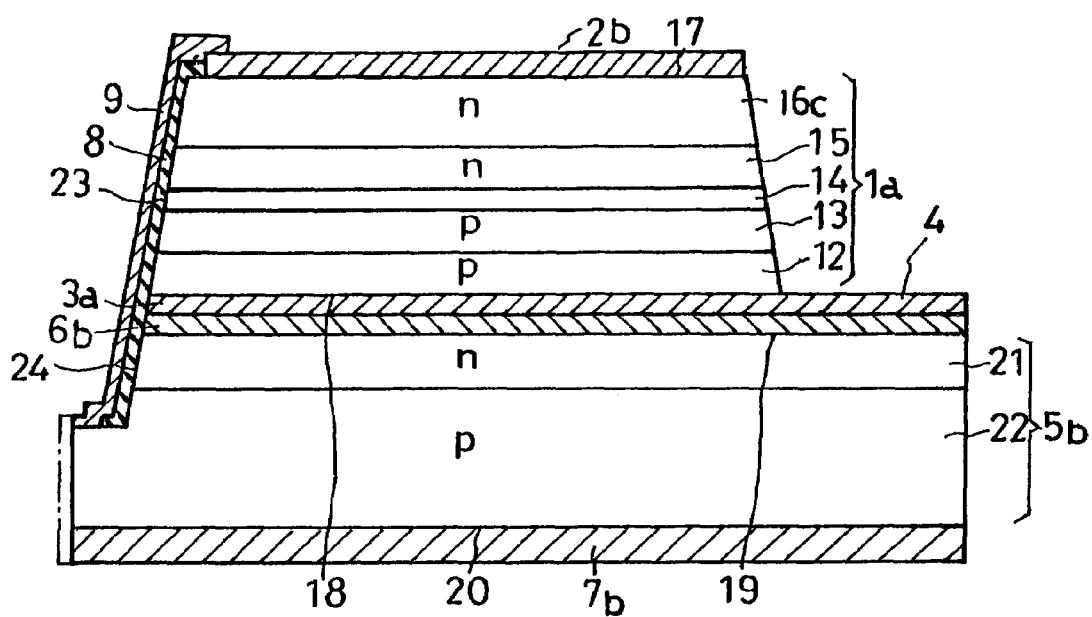
FIG. 12 is a view similar to FIG. 1 but showing a yet further preferred form of overvoltage-protected LED according to the invention.

The overvoltage-protected light-emitting device shown in FIG. 12 differs from all the foregoing embodiments in that light issues from the protector baseplate $5_a$ rather than directly from the light-generating semiconductor region $1_a$. Toward this end the FIG. 12 device employs a transparent conductor layer $3_a$ in place of the reflector 3 on the second major surface 18 of the light-generating semiconductor region $1_a$. While this region $1_a$ is itself of the same construction as its FIG. 11 counterpart identified by the same reference characters, its first major surface 17 is wholly or nearly wholly (80 percent or more) covered by a first electrode $2_b$ of a reflective metal or alloy. The first electrode $2_b$ is in direct contact with the n-type contact layer $16_c$, not with the current-spreading layer 16 of FIG. 1. Not only is the conductor layer $3_a$ transparent, but so are the bonding metal layer $6_b$, protector baseplate $5_b$, and electrode metal layer $7_b$.

Thus the light generated at the active layer 14 partly passes directly into and through the transparent protector baseplate $5_b$ and issues from the transparent electrode metal layer $7_b$. Radiated in a direction away from the protector baseplate $5_b$, the rest of the light is mostly reflected by the reflective first electrode $2_b$ of the LED and, traveling through the light-generating semiconductor region $1_a$ and protector baseplate $5_b$, also emitted from the electrode metal layer $7_b$. Despite this change in light path, the device of FIG. 12 is essentially equivalent in construction to that of FIG. 1.

POSSIBLE MODIFICATIONS

Notwithstanding the foregoing detailed disclosure it is not desired that the present invention be limited by the exact showings of the drawings or the description thereof. The following is a brief list of possible modifications, alterations or adaptations of the illustrated devices and detailed manufacturing methods thereof according to the invention which are all believed to fall within the purview of the claims annexed hereto:

1. The bonding pad electrode 2 could be formed on the first major surface 17 of the light-emitting semiconductor region 1 via a transparent electrode.
2. Either or both of the n-type cladding 15 and current-spreading layer 16 in FIG. 1 could be made to protrude laterally outwardly of the active layer 14, and the first electrode 2 cold be formed on the underside of the protuberance.
3. Both varistor $11_a$, FIG. 7, and capacitor $11_b$, FIG. 8, could be made greater in transverse dimension than the overlying light-generating semiconductor region 1.
4. The electrical connections of the varistor $11_a$ and capacitor 11 are modifiable as indicated in FIGS. 1, 5, 6, 11 and 12.
5. In the embodiments of FIGS. 1 and 5-8 an opening may be created at least in that part of the reflector 3 which lies across the light-generating semiconductor region 1 from the first electrode 2, and, with or without an electrically insulating material filled therein, used for limiting current flow to that part of the active layer 12 which is opposed to the first electrode 2. The opening will serve the purpose of the known current blocking layer, contributing toward a higher efficiency of light production.
6. Similarly, an opening may be created in that part of the open-worked ohmic contact layer 60, FIG. 9, and of the solid ohmic contact layer $60_a$, FIG. 10, which likes across the light-generating semiconductor region 1 from the first electrode 2, for the same purpose as above.
7. The light generating semiconductor regions 1 and $1_a$ could be made from Groups III-V compound semiconductors other than nitride semiconductors.
8. The protector baseplate 5 and ceramic dielectrics 40 and 50 could be made from semiconductors other than silicon and ceramics, examples being silicon carbide and Groups III-V compound semiconductors.
9. The indicated conductivity types of the various parts of all the devices disclosed herein are reversible.
10. The protector baseplate 3 could be joined directly to the reflector 3 under heat and pressure, without using the bonding metal layer 6.
11. Again without using the bonding metal layer 6, the second major surface 18 of the light-generating semiconductor region 1 could be joined under heat and pressure to the reflector 3 that has been preformed on the protector baseplate 5.

12. The zener diode 11, FIG. 2, is replaceable by other types of diodes that nondestructively break down at a prescribed voltage.

13. The light-generating semiconductor region could be combined with an overvoltage protector that is effective in one direction only.

What is claimed is:

1. A light-emitting semiconductor device protected against electrical breakdown due to overvoltages, comprising:
    (a) a light-generating semiconductor region comprising a first and a second semiconductor layer of opposite conductivity types for generating light, the light-generating semiconductor region having a first major surface and a second major surface, opposite to the first major surface;
    (b) a first electrode disposed on the first major surface and electrically connected to the first semiconductor layer of the light-generating semiconductor region;
    (c) an electric conductor layer disposed on the second major surface and connected both electrically and mechanically to the second semiconductor layer of the light-generating semiconductor region wherein the conductor layer covers the entire second major surface of the light-generating semiconductor region;
    (d) a second electrode electrically connected to the conductor layer; and
    (e) an overvoltage protector connected both electrically and mechanically to the conductor layer for protecting the light-generating semiconductor region from overvoltage, wherein the overvoltage protector is in the form of a semiconductor baseplate bonded to part of the second major surface of the light-generating semiconductor region via the conductor layer,
    wherein the second electrode is a bump electrode formed on the rest of the second major surface of the light-generating semiconductor region via the conductor layer.

2. The overvoltage-protected light-emitting semiconductor device of claim 1, wherein the overvoltage protector is in the form of a semiconductor baseplate bonded to the second major surface of the light-generating semiconductor region via the conductor layer.

3. The overvoltage-protected light-emitting semiconductor device of claim 2, wherein the semiconductor baseplate is constituted of a protector diode comprising:
    (a) a first semiconductor region of a first conductivity type bonded to the conductor layer;
    (b) a second semiconductor region of a second conductivity type disposed contiguous to the first semiconductor region; and
    (c) a connector for connecting the second semiconductor region to the first electrode.

4. The overvoltage-protected light-emitting semiconductor device of claim 3, wherein the connector extends over the semiconductor baseplate and the light-generating semiconductor region.

5. The overvoltage-protected light-emitting semiconductor device of claim 3, wherein the connector extends through a channel cut in the semiconductor baseplate and the light-generating semiconductor region.

6. The overvoltage-protected light-emitting semiconductor device of claim 2, wherein the semiconductor baseplate is bonded to the conductor layer via a bonding layer of electroconductive material.

7. The overvoltage-protected light-emitting semiconductor device of claim 2, wherein the semiconductor baseplate is higher in heat conductivity than the light-generating semiconductor region.

8. The overvoltage-protected light-emitting semiconductor device of claim 1, wherein the conductor layer is made from reflective material for reflecting the light from the light-generating semiconductor region for emission from the first major surface of the light-generating semiconductor region.

9. The overvoltage-protected light-emitting semiconductor device of claim 1, wherein the conductor layer is made from silver or silver-base alloy.

10. The overvoltage-protected light-emitting semiconductor device of claim 1, wherein the light-generating semiconductor region further comprises:
    (a) an active layer between the first and the second semiconductor layer; and
    (c) a multi-sublayered current-spreading layer between the first electrode and the first semiconductor layer of the light-generating semiconductor region, the current-spreading layer being capable of generating two-dimensional electron gas.

11. The overvoltage-protected light-emitting semiconductor device of claim 1, wherein the overvoltage protector is a zener diode.

12. The overvoltage-protected light-emitting semiconductor device of claim 1, wherein the overvoltage protector is a varistor.

13. The overvoltage-protected light-emitting semiconductor device of claim 1, wherein the overvoltage protector is a capacitor.

14. A light-emitting semiconductor device protected against electrical breakdown due to overvoltages, comprising:
    (a) a light-generating semiconductor region comprising a first and a second semiconductor layer of opposite conductivity types for generating light, the light-generating semiconductor region having a first major surface and a second major surface, opposite to the first major surface;
    (b) a first electrode disposed on the first major surface and electrically connected to the first semiconductor layer of the light-generating semiconductor region;
    (c) an electric conductor layer disposed on the second major surface and connected both electrically and mechanically to the second semiconductor layer of the light-generating semiconductor region;
    (d) a second electrode electrically connected to the conductor layer; and
    (e) an overvoltage protector connected both electrically and mechanically to the conductor layer for protecting the light-generating semiconductor region from overvoltage wherein the overvoltage protector is in the form of a semiconductor baseplate bonded to the second major surface of the light-generating semiconductor region via the conductor layer, wherein the conductor layer and the semiconductor baseplate are transparent to the light generated by the light-generating semiconductor region,
    wherein the first electrode on the first major surface of the light-generating semiconductor region is made from reflective material for reflecting the light for emission through the semiconductor baseplate.

* * * * *